United States Patent [19]

Hirai

[11] Patent Number: 5,135,607
[45] Date of Patent: Aug. 4, 1992

[54] PROCESS FOR FORMING DEPOSITED FILM

[75] Inventor: Yutaka Hirai, Hikone, Japan

[73] Assignee: Canon Kabushiki Kaisha, Tokyo, Japan

[21] Appl. No.: 666,448

[22] Filed: Mar. 11, 1991

Related U.S. Application Data

[63] Continuation of Ser. No. 327,429, Mar. 24, 1989, abandoned, which is a continuation of Ser. No. 183,444, Apr. 13, 1988, abandoned, which is a continuation of Ser. No. 36,809, Apr. 10, 1987, abandoned.

[30] Foreign Application Priority Data

Apr. 11, 1986 [JP] Japan .................. 61-83930
Apr. 6, 1987 [JP] Japan .................. 62-85515

[51] Int. Cl.$^5$ .............................. C23C 16/00
[52] U.S. Cl. ............................ 156/643; 156/646; 156/662; 427/38; 427/70; 427/255; 427/255.2
[58] Field of Search .................. 156/646, 643, 662; 427/255.2, 255, 70, 38, 255.1, 228

[56] References Cited

U.S. PATENT DOCUMENTS

| | | | |
|---|---|---|---|
| 3,977,925 | 8/1976 | Schwabe | 156/647 |
| 4,147,571 | 4/1979 | Stringfellow et al. | 156/610 |
| 4,443,488 | 4/1984 | Little et al. | 427/38 |
| 4,488,914 | 12/1984 | Quinlan et al. | 156/610 |
| 4,492,736 | 1/1985 | Tanner | 427/39 X |
| 4,522,662 | 6/1985 | Bradbury et al. | 156/610 |
| 4,546,008 | 10/1985 | Saitoh et al. | 427/38 |
| 4,592,933 | 6/1986 | Meyerson et al. | 427/255.2 X |
| 4,596,626 | 6/1986 | Schlichta et al. | 156/610 |
| 4,608,117 | 8/1986 | Ehrlich et al. | 156/610 |
| 4,676,194 | 6/1987 | Satou et al. | 118/723 |
| 4,689,093 | 8/1987 | Ishihara et al. | 118/723 |
| 4,696,834 | 9/1987 | Varaprath | 427/255.2 X |

FOREIGN PATENT DOCUMENTS

| | | | |
|---|---|---|---|
| 0241317 | 10/1987 | European Pat. Off. | |
| 3429899 | 3/1985 | Fed. Rep. of Germany | |
| 0240916 | 11/1986 | Netherlands | 156/610 |
| 2087930 | 6/1982 | United Kingdom | |

OTHER PUBLICATIONS

Jastrzebski et al., "Growth Process . . . Overgrowth Technique" J of Electro Chem. Soc. vol. 130 No. 7 Jul. 1983 pp. 1571–1580.

Primary Examiner—Thi Dang
Attorney, Agent, or Firm—Fitzpatrick, Cella, Harper & Scinto

[57] ABSTRACT

A process for forming a crystalline deposited film on a substrate surface by preparing the substrate surface on which spaced crystal nuclei are present for forming the crystalline deposited film, forming the crystalline deposited film by introducing an activated species (A) formed decomposition of a compound (SX) containing silicon and a halogen and an activated species (B) formed from a chemical substance for film formation which is chemically mutually reactive with the activated species (A) whereby a mixture is formed between the two activated species to cause a chemical reaction therebetween and thereby affect the formation of the crystalline deposited film. An etching action is thereafter produced on the crystalline deposited film by exposing the film to a gaseous substance (B) capable of effecting an etching action to effect crystal growth in specific face direction.

2 Claims, 4 Drawing Sheets

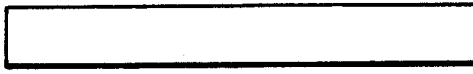
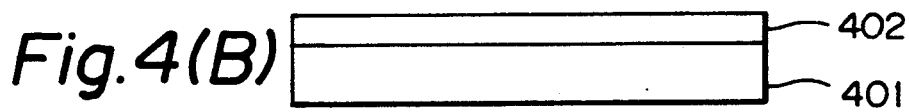
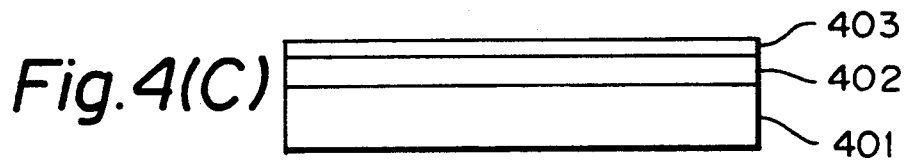
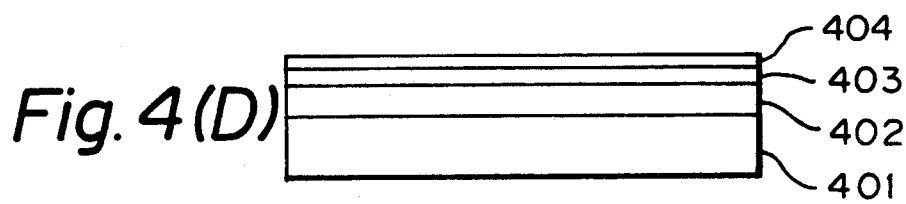
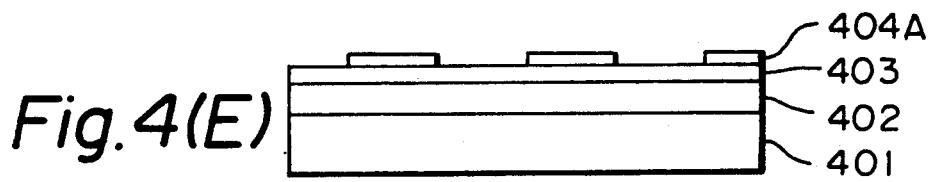
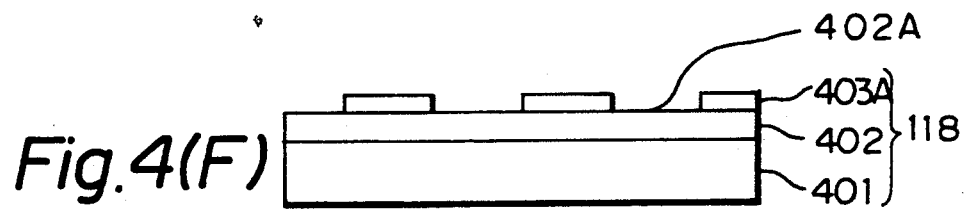
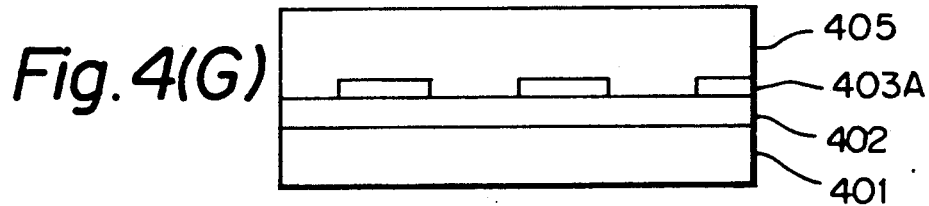

PROCESS FOR FORMING DEPOSITED FILM

This application is a continuation of application Ser. No. 07/327,429 filed Mar. 24, 1989, now abandoned, which is a continuation of application Ser. No. 07/183,444 filed Apr. 13, 1988, now abandoned, which is a continuation of application Ser. No. 07/036,809 filed Apr. 10, 1987, now abandoned.

BACKGROUND OF THE INVENTION

1. Field of the Invention

This invention relates to a process for forming a functional deposited film containing silicon, above all a functional film, particularly a deposited film of crystalline silicon to be used for semiconductor device, photosensitive device, line sensor for image input, image pick-up device, etc.

2. Related Background Art

For example, for formation of polycrystalline silicon film, the normal pressure CVD method, the LPCVD method, the plasma CVD method, etc., have been primarily used, and, in general, the LPCVD method has been widely been used and industrialized.

However, in the method of the prior art, for example, in the LPCVD method, the substrate temperature is high and cheap glass substrates, etc., cannot be used, and no deposited film having practically useful characteristics cannot be obtained at low temperature. Also, in the plasma CVD method, while there is the advantage of making the substrate temperature lower than the LPCVD method, its reaction process is complicated, and not a few ambiguities existed in its reaction mechanism.

Also, there are a large number of parameters for formation of deposited film (e.g. substrate temperature, flow rates and the ratios of gases introduced, pressure during film formation, high frequency power, electrode structure, structure of reaction vessel, evacuation speed, plasma generation system, etc.), and the plasma formed by combination of such a large number of parameters may sometimes become unstable to give frequently markedly bad influences to the deposited film formed. Besides, in the plasma CVD method, it is difficult to avoid damages by collision of ions or electrons against the film which is an obstacle against obtaining a film of good quality.

As described above, in formation of a crystalline silicon film it has been desired to develop a method for forming a polycrystalline silicon or single crystal silicon film of good quality with a large area by means of a device of low cost while maintaining its practically, useful characteristics and uniformness. These are also applicable to other functional films such as silicon carbide films, silicon nitride films, silicon oxide films, etc.

SUMMARY OF THE INVENTION

The present invention provides a novel process for formation of a crystalline deposited film which solves the problems of the plasma CVD method as described above and also uses no formation method of the prior art.

Another object of the present invention is to provide a process for forming a crystalline deposited film which is suitable for enlargement of the film and can easily accomplish improvement of productivity and bulk production of the film while attempting to improve the characteristics of the film formed, the film forming speed and reproducibility and also to uniformize film quality.

The present invention which accomplishes the above objects comprises:

(a) the step of arranging a substrate having a portion comprising a material which becomes the crystal nucleus for formation of a deposited film or a material capable of forming selectively said crystal nucleus into a film forming space for formation of a deposited film;

(b) the film forming step of introducing an activated species (A) formed by decomposition of a compound containing silicon and a halogen and an activated species (B) formed from a chemical substance for film formation which is chemically mutually reactive with said activated species (A) separately from each other into said film forming space to effect chemical reaction therebetween and form a deposited film on said substrate;

(C) the step of exposing the deposited film growth surface to a gaseous substance having etching action on the deposited film to be formed during the film forming step to apply etching action on said deposited film growth surface, thereby effecting preferentially crystal growth in a specific face direction.

The method for forming deposited film of the present invention having the constitution as specified above has one specific feature in forming a deposited film without through the plasma reaction in the forming space by use of an activated species (A) formed by decomposition of a compound containing silicon and a halogen and an activated species (B) formed from a chemical substance for film formation which is chemically mutually reactive with said activated species (A) in place of the plasma CVD method of the prior art in which plasma discharging is formed by permitting discharging energy, etc., to act on the starting gases for film formation, whereby it has the advantage of being not influenced by abnormal discharging, etc., during film formation, etc.

Also, the method for forming deposited film of the present invention has another specific feature in effecting crystal growth preferentially in a specific face direction by applying etching action on the growth surface of the above deposited film by subjecting the deposited film forming surface to a gaseous substance having etching action on the deposited film to be formed, whereby there is the advantage that a crystalline deposited film with a specific face direction having uniform film thickness and uniform film quality can be obtained.

Also, the method for forming deposited film of the present invention utilizes the chemical reaction through contact of said activated species (A) with said activated species (B) without requiring high temperature for formation of deposited film, and therefore there is no disturbance of the structure caused by heat and also no heating installation during production and its cost accompanied with running thereof are needed, whereby the device can be reduced in cost. And, it becomes possible to select the substrate from a wide scope of materials without dependence on heat resistance.

Also, according to the method for forming deposited film of the present invention, enlargement of area is possible without dependence on the shape or size of the substrate and at the same time the starting materials can be very little, whereby the film forming space can be made smaller to improve dramatically the yield.

Also, according to the method for forming deposited film of the present invention, the size of the crystal grain can be determined by arranging the nucleus for crystal growth as desired on the substrate, whereby a crystalline deposited film having characteristics suited for the purpose can be deposited at any desired region.

Also, according to the method for forming deposited film of the present invention with the constitution as described above, it becomes possible to form a good crystalline deposited film having uniform film quality and characteristics over a large area with easy control of film quality simultaneously with energy saving in formation of deposited film. Further, a crystalline deposited film of high quality with excellent characteristics such as electrical, optical, semiconductor characteristics can be obtained efficiently with excellent productivity and bulk productivity.

BRIEF DESCRIPTION OF THE DRAWINGS

FIGS. 2(A)–2(F), 3(A)–3(E) to FIGS. 4(A)–4(G) illustrate respectively the steps of fabricating a substrate of the present invention.

DESCRIPTION OF THE PREFERRED EMBODIMENT

Figure 1:
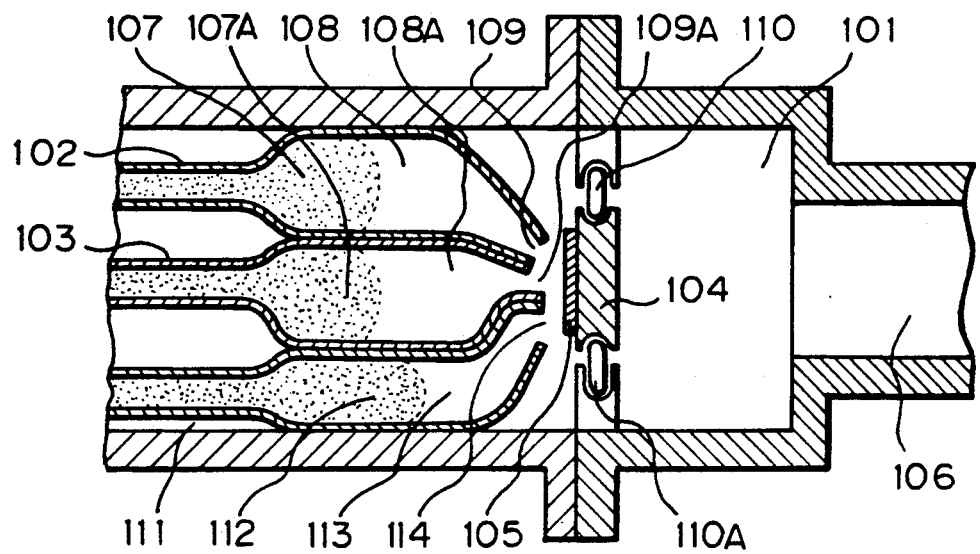
FIG. 1 is a sectional view of the device for forming deposited film of the present invention.

In the process of the present invention, in place of exciting plasma in the film forming space for formation of a deposited film, chemical mutual interaction is caused to occur in the co-presence of an active species (A) formed by decomposition of a compound containing silicon and a halogen with applying activation energy in an activation space (A) distinct from the film forming space and an active species (B) formed from a chemical substance for film formation, and therefore the deposited film formed is not subjected to bad influences from plasma, sputtering of ions or the like formed or electrons, etc. Also, according to the present invention, by controlling the atmosphere temperature in the film forming space and the substrate temperature freely as desired, the CVD method can be made more stable.

One of the points of the process of the present invention different from the CVD process of the prior art is use of activated species which are previously activated in a space different from the deposition space (hereinafter referred to as activation space). By doing so, the film forming speed can be dramatically increased, and also the substrate temperature can be lowered to a great extent. Further, in addition, by the effect of the etching species, it has become possible to deposit a polycrystalline film having only a specific face direction of crystal and a good quality with strong orientability and large grain size.

In the present invention, the activated species (A) from the activation space (A) should preferably be selected and used as desired from those having the life of 0.1 sec. or longer, more preferably 1 sec. or longer, optimally 10 sec. or longer, from the standpoint of productivity and easiness in handling, and the constituent elements of the active species (A) become the components constituting the deposited film formed in the film forming space. Also, the chemical substance for film formation is activated to become the active species (B) by the action of an activation energy in the activation space (B) before introduction into the film forming space, and introduced from the activation space (A) at the same time during formation of the deposited film to undergo chemical mutual reaction with the active species (A) containing constituent elements which become the constituent components of the deposited film formed.

In the present invention, as the compound containing silicon and halogen to be introduced into the activation space (A), there may be employed, for example, chain or cyclic silane compounds of which hydrogen atoms are partially or wholly substituted with halogen atoms, typically chain silicon halides represented by $Si_uY_{2u+2}$ (u is an interger of 1 or more, Y is at least one element selected from F, Cl, Br and I) and cyclic silicon halides $Si_vY_{2v}$ (v is an integer of 3 or more, and Y has the same meaning as defined above), chain and cyclic compounds represented by $Si_uH_xY_y$ (u and Y have the same meaning as defined above, $x+y=2u$ or $2u+2$).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_2Cl_2$, $SiH_3Cl$, $SiHBr_3$, $SiHI_3$, $Si_2Cl_3F_3$, and the like.

For formation of the activated species (A), in addition to the above compound containing silicon and halogen, other silicon compounds, simple substance of silicon, hydrogen, halogen gases (e.g. $F_2$ gas, $Cl_2$ gas, gasified $Br_2$, $I_2$, etc.) can be used in combination, if desired.

In the present invention, as the method for forming activated species (A) in the activation space (A), there may be employed various activation energies such as electrical energies, including microwave, RF, low frequency DC, etc., heat energies such as heater heating, IR-ray heating, etc., photoenergy, etc. in view of respective conditions and the device.

As the above chemical substance for film formation for forming active species (B) in the activation space (B), hydrogen gas and/or halogen gases (e.g. $F_2$ gas, $Cl_2$ gas, gasified $Br_2$, $I_2$, etc.) may be advantageously used. Also, in addition to these chemical substances for film formation, for . example, an inert gas such as helium, argon, neon, etc., may be employed. When a plural number of these chemical substances for film formation are employed, they can be previously mixed and introduced under gaseous state into the activation space (B), or alternatively these chemical substances for film formation may be fed individually from the respective independent feeding sources to be introduced into the activation space (B), or they can be introduced into the respective independent activation spaces to be individually activated.

In the present invention, the proportion in amount of the above activated species (A) to the activated species (B) to be introduced into the film forming space may suitably be determined depending on the depositing conditions, the kind of the activated species, etc., but may preferably be 10 : 1 to 1 : 10, more preferably 8 : 2 to 4 : 6.

Also, the deposited film formed according to the present invention can be doped with an impurity element so-called in the art of semiconductor during or after film formation. As the impurity element to be used, there may be employed, as p-type impurity, an element belonging to the group IIIA of the periodic table such as B, Al, Ga, In, Tl, etc. and, as n-type impurity, an element belonging to the group VA of the periodic table such as N, P, As, Sb, Bi, etc. as suitable ones.

Particularly, B, Ga, P and Sb are most preferred. The amount of the impurity to be doped may be determined suitably depending on the desired electrical and optical characteristics.

As the substance containing such an impurity atoms as the component (substance for introduction of impurity), it is preferable to select a compound which is gaseous under normal temperature and normal pressure, or gaseous at least under the conditions for formation of deposited film and can be readily gasified by a suitable gasifying device. Such compounds may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The compounds containing impurity element may be used either singly or as a combination of two or more compounds.

The substances for introduction of impurities may be directly introduced under gaseous state into the film forming space, or alternatively activated previously in the activation space (A) or the activation space (B) or a third activation space (C) before introduction into the film forming space.

In the present invention, during the film forming step, that is (a) during film formation etching action is applied on the growth surface of deposited film at the same time, or (b) etching action is applied on the growth surface of deposited film with intermission of film formation, whereby crystal growth can be effected preferentially in a specific face direction to give a deposited film with good crystallinity. The etching action in the case of the above (b) may be effected within the film forming space or alternatively in an etching space separate from the film forming space.

As the gaseous or readily gasifiable substance for etching (E) having etching action on the deposited film containing silicon, there may be included simple substances of halogen, halogen compounds or activated species (C) formed from these.

These substances (E) for etching may be introduced under gaseous state into the space where etching action is applied, or alternatively in the case when the substance (E) is formed by the surface reaction on the surface of the deposited film of the above activated species (A) or the above activated species (B) or formed from the chemical reaction between the activated species (A) and the activated species (B), etching action is applied on the growth surface of the deposited film simultaneously with film formation.

For example, as an example in which the substance for etching (E) is formed by the above surface reaction, the reaction between an activated species of halogen and hydrogen or a halogen and activated species of hydrogen occurs on the growth surface of the deposited film, and hydrogen halide (HX) is released from the growth surface of the deposited film and the hydrogen halide becomes the substance (E) for etching.

As the substance (E) having etching action in the present invention, there may be employed halogens such as $F_2$, $Cl_2$, gasified $Br_2$, $I_2$, etc., halogenated carbon such as $CHF_3$, $CF_4$, $C_2F_6$, $CCl_4$, $CBrF_3$, $CCl_2F_2$, $CCl_3F$, $CClF_3$, $C_2Cl_2F_4$, etc., halides including typically boron halides such as $BCl_3$ and $BF_3$ and in addition, $SF_6$, $NF_3$, $PF_5$, etc., and further radicals such as $F^*$, $Cl^*$, ions such as $CF_3^+$, $CCl_3^+$; from these gases. These can be used also as mixtures, and the etching characteristics can be controlled by adding $O_2$, $H_2$ and other gases in amounts which do not affect the film.

As the method for etching using these substance (E), etching and film formation may be repeated alternately by providing separately an etching space, or the substance (E) can be introduced under the state having etching activity into the film forming space to effect etching action simultaneously with film formation, thereby giving the effect of limiting the growth direction of the crystalline film to accomplish the object of the present invention.

On the other hand, the dependency of grow&h speed upon face direction has been found during crystal growth of silicon or silicon containing materials. This may differ depending on the deposited film forming method or deposition conditions, but in the method of the present invention, the preferential order has been found to be (110)>(111)>(100). By suitable selection of the kind of substance (E) for etching and etching condition under this condition, the condition with stronger orientability of (110)>>(111)>>(100) can be realized. It is realized in the present invention to strengthen the above orientability and accelerate the growth speed, particularly by setting a portion for accelerating nucleation on the substrate. And, not only formation of polycrystalline deposited film with great grain size oriented only toward the (110) face is possible, but it is also possible to grow a single crystal by selecting the size, shape, interval, material, etc., of the nucleus.

In the present invention, the expression crystalline deposited film of course represents a polycrystal line and a single crystal film. The surface for promoting nucleation of the present invention may sometimes exists on the whole surface of the substrate, or sometimes as a part thereof, or otherwise many portions may be provided as separately dispersed for promoting nucleation, it must be considered that the active species (A) in the vicinity of the substrate formed from compounds containing silicon and a halogen has a great coefficient of attachment. In order to enhance the coefficient of attachment, a material having a large coefficient of attachment may be employed or a surface structure for enhancing the coefficient of attachment may be formed.

Coefficient of attachment generally refers to a quantity which is a measure for readiness in chemical absorption to occur, and in the case of the present invention, physical adsorption and chemical adsorption including dissociation are also included. As the material enhancing the coefficient of attachment, those with surface unevenness of some 1000 Å or less are preferred. As to the shape, those with shapes as regular as possible rather than random are preferred.

The material having a large coefficient of attachment may be selected from among insulating substances and semiconductive substances such as Si : N : H, $Si_3N_4$, A-Si : H, Si : N : O : H, $Al_2O_3$, $SiO_2$, $Ta_2O_5$, etc., but particularly a compound containing Si-N is preferred. Also, a metal material may be sometimes employed. As mentioned above, the order of stronger orientability of crystal has been made as (110)>(111)>(100), but of course it is possible in the present invention to control the direction of oriented surface and the direction of the single crystal grow&h face depending on the conditions of deposition and nucleus.

The portion for promoting nucleation of the present invention do not have to be uniformly spread over the whole substrate surface, but a film with regular sizes of crystal grains and crystal axis directions may be obtained by giving places where nuclei are liable to be generated locally.

In the method of the present invention, for forming selectively a desired crystalline deposited film as described above, it is necessary to arranged previously a material which becomes crystal nuclei for the deposited film to be formed or a material capable of forming selectively the crystal nuclei in the form corresponding to the purpose at the place corresponding to the purpose on the substrate surface.

In the former case, by using a single crystal substrate covered partially with an amorphous thin film as a substrate or by arrangement of single crystalline grains on the substrate, the same material as the single crystal can be subjected selectively to epitaxial growth with the exposed portion of the single crystal substrate or the single crystalline grains becoming crystal nuclei.

Also, by selecting suitably the film forming conditions and the kind of the crystalline material which become crystal nuclei, crystalline deposited films of different kinds can be formed.

In the case of the latter, by utilizing the difference in nucleus formation density according to the kinds of the materials constituting the nucleation surfaces, by arranging the nucleation surfaces scatteringly with a desired pattern on the substrate, desired crystalline deposited film can be formed selectively.

As the substrate to be used in the former case, a silicon single crystal covered with silicon oxide film to have the subbing silicon single crystal exposed, or a substrate with small growth of silicon crystals having silicon single crystal grains arranged thereon may be employed. Further, in place of the silicon crystal as described above, crystals different in kind from silicon may be also used as the nucleus, but the materials of these crystals are required to satisfy the following conditions.

1. The lattice constant of the crystalline material on the substrate surface should be identical with or very approximate to the lattice constant of the deposited film.
2. The coefficients of thermal expansion of the crystalline material on the substrate surface and the deposited film should be identical with or very approximate to each other.

Hence, as the material which should constitute the surface of a suitable substrate for obtaining a deposited film of crystalline Si, there may be included $GaF_2$, $ZnS$, $Yb$, $Mn_3Ga$, $NaCoF_3$, $Ni_3Sn$, $Fe_3C$, $NiTe_x$ ($x \leq 0.7$), $CoMnO_3$, $NiMnO_3$, $MaZn_3$, $CuCl$, $AlP$, $Si$, etc.

Further, even when the above two conditions are not satisfied, by selecting the deposition conditions more adequately, a crystalline deposited film can be also obtained, and the method for forming deposited film of the present invention is not limited to the materials as described above.

As the substrate to be used in the latter case, for example, those having $Si_3N_4$ arranged scatteringly on $SiO_2$ film or those having $SiO_2$ covered over $Si_3N_4$ film to have partially the subbing $Si_3N_4$ exposed may be employed.

These substrates utilize the property of silicon crystal nuclei which are formed with ease on $Si_3N_4$ and with difficulty on $SiO_2$, and in the method for forming deposited film of the present invention, both amorphous and crystalline materials can be used, provided that they have difference in difficulty and easiness in formation of nuclei.

The substrate temperature (Ts) during film formation may be set suitably depending on the kind of the deposited film to be formed and the kind of the substrate used.

Next, the present invention is described by referring to a typical example of the apparatus for forming a deposited film according to the process of the present invention.

FIG. 1 is a partial sectional view showing schematic construction of an example of the device for forming deposited film in which the process of the present invention is practiced.

In FIG. 1, 101 is a deposition chamber (film forming space) in which deposition of silicon thin film is effected, and the deposition chamber 101 is internally connected to an evacuation system not shown through an evacuation outlet 106, whereby the deposition chamber 101 can be maintained at a desired pressure. In the deposition chamber 101, there are provided a set of the introducing pipe 102 for radicals (SX) containing e.g., silicon and a halogen which is the active species (A) and the introducing pipe 103 for e.g., hydrogen radicals as active species (B), respectively. The tips of the respective radical introducing pipes are thick at the acting chambers 108, 108A, and narrowed at the outlets 109, 109A. Within the deposition chamber 101, a substrate supporting member 104 is held by the roller 110 so as to be movable reciprocally in the direction perpendicular to the paper surface. And on said supporting member 104 is held a support 105 for deposition. The respective radicals coming out from the outlet 109, 109A are mixed and reacted with each other in the vicinity of the substrate within the deposition chamber 101 to form a film on the substrate 105. The radicals (SX) and hydrogen radicals are formed from the respective starting material gases in the active species forming chambers such as heating furnaces or plasma chambers, etc., not shown, respectively, and thereafter introduced through the introducing pipes 102, 103, respectively into the acting chambers 108, 108A. Their amounts are controlled by massflow controllers on the gas source side from the heating furnace or plasma chamber.

Roller 110 is provided only for depositing silicon thin film over the whole surface of the substrate by moving the substrate 105.

The introducing pipe 111 is an introducing pipe for another gas having chemical or physical etching activity (etching gas), and in some cases the etching gas is previously activated in the heating furnace or plasma furnace not shown and led to the outlet 114. From the outlet 114, the etching gas for attacking the film is released to cut or exclude selectively the bonds except in the growth direction of the characteristics of the film. Introduction of the etching gas, other than through such separate introduction pipes, can be also done through the introduction pipes 102, 103 mixed with a starting gases, when the reactivity with the starting gases is low.

The present invention is described in more detail by referring to Examples.

EXAMPLE 1

On a flat glass base plate (#7059, produced by Corning Co.), a Si-N-H film containing hydrogen was deposited to about 30 Å according to the glow discharge method at a base plate temperature of 200° C. (dielectric constant of film 6.5, refractive index 2.0), followed by patterning to intervals of 2 $\mu$. By use of this substrate, a silicon thin film was formed thereon by use of device shown in FIG. 1.

By use of SiF$_4$ as the starting material gas for formation of radicals containing silicon and halogen, F$_2$ as etching gas was mixed therewith and the mixture was permitted to flow into the reaction furnace maintained at 1100° C. to be decomposed, and then released through the introducing pipe 102 into the acting chamber 108. At the same time, H$_2$ gas was permitted to flow into the introducing pipe 103 and discharging was effected in said introducing pipe 103 by introducing microwave of 2.45 GHz at a power of 0.5 w/cm$^2$ to decompose H$_2$, followed by release of the decomposed product into the acting chamber 108. The substrate temperature was maintained at 250° C. The flow rate ratios of the reactive starting gases at this time were varied as 5/100, 20/100, 30/100, 60/100, 80/100 of F$_2$ gas/SiF$_4$ decomposed gas (unit is SCCM), and a pressure of 0.5 Torr was maintained for 1 hour for each case, whereby the films having the properties as shown in Table 1 were deposited. Of the respective samples, when drift mobility was measured for No. 2, 3 and 4, it was found to be 30 cm$^2$/V.sec for No. 2, 47 for No. 3 and 18 for No. 4. Thus it has been found that a very good polycrystalline film with strong orientability can be prepared. Since crystallinity is better as the deposition rate is lowered as shown in Table 1, the grain size becomes greater by the effect of etching as described in the former part of the present invention to improve orientability.

EXAMPLE 2

By means of the same device as used in Example 1, a film was formed on the same Corning #7059 base plate having SiNH deposited thereon as in Example 1 as the substrate by permitting active species of Si$_2$F$_6$ as the source material to flow into the introducing pipe 102 and introducing active species formed from H$_2$ into the introducing pipe 103. By use of Si$_2$F$_6$ as the starting gas for formation of radicals containing silicon and halogen, this was permitted to flow into the reaction furnace maintained at 800° C. to be decomposed, followed by release from the introducing pipe 102 into the acting chamber 108. At the same time, F$_2$ was permitted to flow through the introducing pipe 111, and discharging was effected by introducing microwave of 2.45 GHz at a power of 0.7 w/cm$^2$, and the discharged product was released into the acting chamber 113. H$_2$ gas was permitted to flow through the introducing pipe 103, discharging was effected by introducing microwave of 2.45 GHz at a power of 0.5 w/cm$^2$ to decompose H$_2$ and the decomposed product was released into the acting chamber 108. The substrate temperature was maintained at 310° C. At this time, the flow rate ratios of the respective starting gases were changed as 5/100, 15/100, 25/100, 35/100, 50/100 of F$_2$ gas/Si$_2$F$_6$ decomposed gas, with H$_2$ being made constant 30 SCCM, and a pressure of 0.5 Torr was maintained for 1 hour for each case, whereby the films as shown in Table 2 were deposited. Of the respective samples, drift mobility was measured for Nos. 8 and 9, and it was found to be 80 cm$^2$/V.sec for No. 8 and 65 for No. 9. Thus, it has been found that very good polycrystalline film with strong orientability can be prepared. The grain si±e was measured by use of X-ray diffract meter and an electron microscope.

EXAMPLE 3

Figure 5:
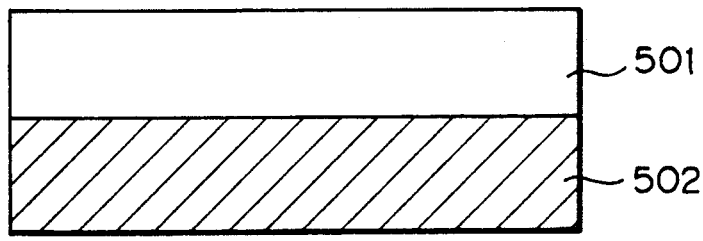
FIG. 5 is a schematic sectional view showing an example of deposited film formed on a certain substrate according to the process of the present invention.
Figure 6:
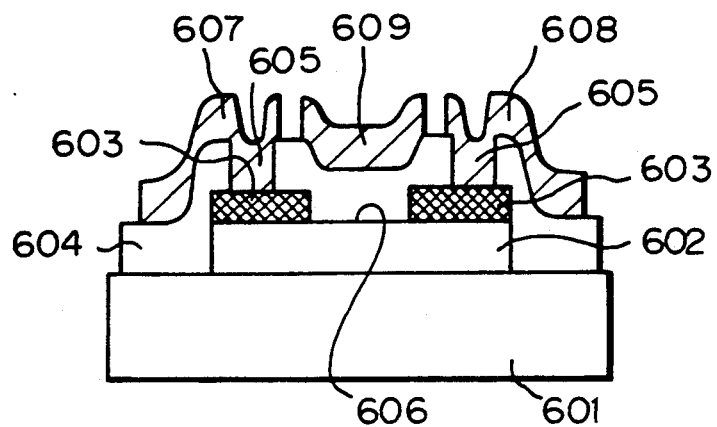
FIG. 6 shows schematically the structure of a TFT fabricated using a deposited film obtained by the process of the present invention.

By use of the same conditions as in samples Nos. 3 and 8 in Examples 1 and 2, a thin film transistor (hereinafter abbreviated as TFT) as shown in FIG. 6 was prepared. After deposition of a Si semiconductor polycrystalline layer 502 as shown in FIG. 5 with a film thickness of 0.5 μm on a glass (Corning #7059) base plate 501 subjected to patterning with SiNH under the above conditions, TFT was prepared by use of the process for preparation of the upper gate coplanar TFT.

First, according to the glow discharge method, an n+ layer (specific resistivity $\sigma \approx 1$ Ω·cm) which is the ohmic contact layer 603 doped with P was formed to a thickness of 1000 Å, and then an active layer 602 was remained by photolithography, followed by etching of the channel portion 606 to form the above contact layer 603. Then, by use of the glow discharge method, NH$_3$ and SiH$_4$ were decomposed to deposit a Si-N-H film with a film thickness of 3000 Å, dielectric constant of 67 and a dielectric strength $\times 10^6$ V/cm $V_{FB} \approx 0V$ at a substrate temperature of 200° C. Then contact holes 605 for source and drain were opened, Al was deposited to 5000 Å by vacuum vapor deposition as the upper electrode, and the source electrode 607, the gate electrode 609 and the drain electrode 608 were respectively formed by photolithography. The gate width W and the gate length L were respectively 600 μ and 20 μ. The characteristics when the drain electrode was earthed and various ⊕ voltages were applied on the source electrode and the gate electrode were measured. In the drain current $I_D$ - drain voltage $V_D$ characteristic, good saturation characteristics were obtained in both Nos. 3 and 8 to give a high current of $\times 10^{-4}$ A at a gate voltage of 10 V and a drain voltage of 10 V. The TFT characteristics obtained from the results of measurement of the drain current $I_D$ at various gate voltage $V_D$ are shown in Table 3.

The TFT by use of the film as obtained above was found to have good characteristics.

EXAMPLE 4

By means of the same device as in Example 1, a film was deposited at a substrate temperature of 280° C. As the substrate, Corning glass substrate, SiNH film 30 Å (prepared under the same conditions as in Example 1) and A-Si:H film 80 Å (hydrogen 10%, prepared by the glow discharge method at a substrate temperature of 300° C.) were respectively formed into sizes of 0.5 μ and 1.5 μ square by patterning, and arranged two-dimensionally with intervals of 10 μ and 80 μ. When deposition was conducted under the condition of F$_2$ gas flow rate/SiF$_4$ decomposed gas flow rate of 20/100 under otherwise the same conditions as in Example 1, grains grew with the respective nuclei as the centers and polycrystal of very large grains of 10 μ and 80 μ were found to grow corresponding to the intervals of nuclei. The orientation was (110) orientation and it was found that orientation within the face was also good as approximate to single crystal in the case of nucleus in the direction of small size of 0.5 μ and also in the case of using A-Si:H.

EXAMPLE 5

When deposition was conducted under the same condition as in Example 1 by use of (100), (111), (110) of single crystal Si, a complete single crystal having (100) face was found to grow at 2.0 Å/sec to a thickness of 7000 Å in the case of using the (100) substrate under the condition of $F_2/SiF_4=60/100$. The pattern of the reflective electron beam diffraction of the film was found to be shaped in streaks and also chrysanthemum pattern was observed, and as the result of measurement of whole mobility, a value of 750 cm$^2$/sec comparable to single crystal was obtained.

EXAMPLE 6

The substrate 118 was prepared according to the steps shown in FIG. 2. First, a polycrystalline silicon substrate 201 as shown in FIG. 2(A) was washed and then a thin silicon oxide film 202 was deposited on the whole surface of the substrate 201 according to the sputtering method (in this case, other than the sputtering method, various thin film deposition method, MBE method, CVD method, etc., may be employed). [FIG. 2 (B)].

Subsequently, an electron beam resist layer 203 was applied on the thin film 202 [FIG. 2 (C)], and the electron beam resist layer 203 was exposed to light by use of a photomask with a desired pattern, and the electron beam resist layer 203 was partially removed by development [FIG. 2 (D)].

With the residual electron beam resist 203A as the mask, the silicon oxide thin film 202 was etched to form a thin film 202A having a desired pattern [FIG. 2 (E)].

According to the steps as described above, a substrate 118 with certain crystal face of the polycrystalline silicon being exposed at constant intervals from the silicon oxide film was obtained. The regions of the silicon crystals exposed on the surface of the substrate 118 had a width of 500 μm and an interval of 300 μm.

Next, by use of the device shown in FIG. 1, a silicon thin film was formed on the above substrate.

First, by use of SiF$_4$ as the starting gas for formation of radicals containing silicon and halogen, it was mixed with F$_2$ as the etching gas and the mixture was permitted to flow into the reaction furnace maintained at 1100° C. to be decomposed therein, followed by release through the introducing pipe 102 into the acting chamber 108. At the same time, H$_2$ gas was permitted to flow into the introducing pipe 103 to be maintained at a pressure of 0.15 Torr, and a microwave of 2.45 GHz was introduced at a power of 0.5 w/cm$^2$ into said introducing pipe 103 to effect discharging and decompose H$_2$, followed by release of the decomposed gas into the activating chamber 108. The substrate temperature was maintained at 250° C. At this time, the amount ratio of the respective starting gases in terms of the flow rate ratio of H$_2$ gas/SiF$_4$ decomposed gas were varied as 5/100, 15/100, 25/100, 30/100, 50/100 (unit is SCCM) and a pressure of 0.5 Torr was maintained for 1 hour for each case. As the result, the films having the properties as shown in Table 4 were deposited. Evaluation of crystallinity of each sample was performed by use of X-ray and electron beam diffraction, and all of them were found to be polycrystalline. Among the respective samples, for samples No. 6-2, 6-3 and 6-4, drift mobility of electrons was measured according to the Van der Pauw method. As the result, it was found to be 42 cm$^2$/V sec for No. 6-2, 58 for No. 6-3 and 22 for No. 6-4. Thus it has been found that a polycrystalline film with very good strong orientation can be prepared.

Figure 2A:
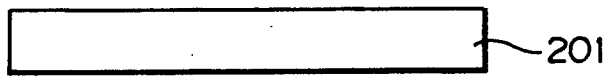
Figure 2B:
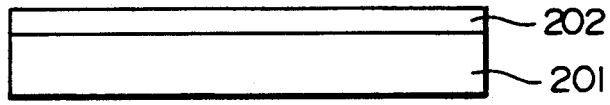
Figure 2C:
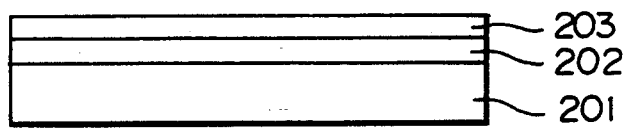
Figure 2D:
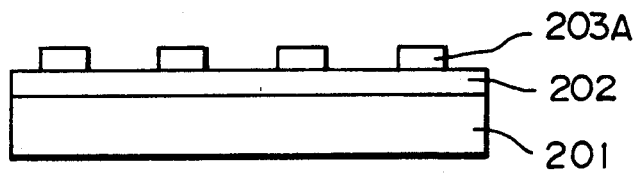
Figure 2E:
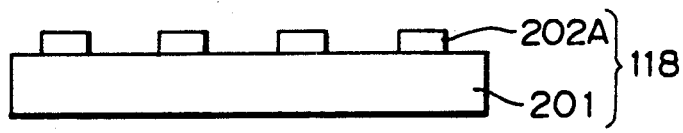
Figure 2F:
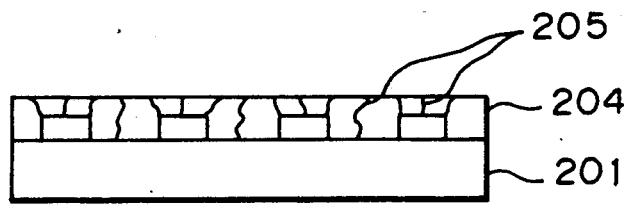

FIG. 2(F) shows a schematic sectional view of the polycrystalline silicon deposited film 204 obtained on the substrate 118.

In FIG. 2(F), 205 shows crystal grain boundary.

EXAMPLE 7

The substrate 118 was prepared according to the steps shown in FIG. 3.

Figure 3A:
Figure 3B:
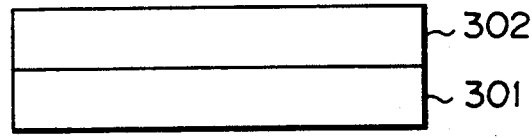
Figure 3C:
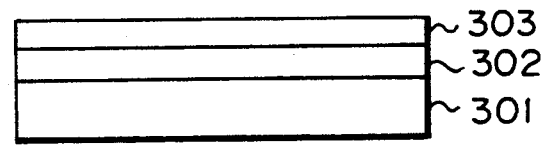
Figure 3D:
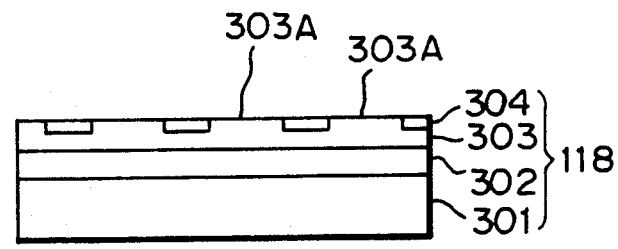

First, a glass substrate 301 comprising substantially uniform composition material as shown in FIG. 3(A) was washed and then amorphous SiN(A-SiN) thin film 302 was formed with a thickness of about 2 μm on the whole surface of the substrate 301 [FIG. 3 (B)].

Subsequently, surface annealing of the above A-SiN thin film 302 was effected in N$_2$ atmosphere by means of a laser annealing device on the above A-SiN thin film 302 to form a crystalline Si$_3$N$_4$ (C-Si$_3$N$_4$) 303 on the surface layer of the A-SiN thin film 302 (to the depth of about 1 μm) [FIG. 3 (C)].

At this time, the laser was irradiated with Ar-CW laser of 4880 Å, at a scanning speed of 2.5 cm/sec and at an energy of 10 W. Subsequently, the surface of the C-Si$_3$N$_4$ layer 303 was scanned by means of the above laser annealing device in O$_2$ atmosphere to form selectively the SiO$_2$ layer 304 [FIG. 3 (D)].

According to the steps as described above, the substrate 118 having C-Si$_3$N$_4$ layer 303A exposed at constant intervals with other portions being covered with SiO$_2$ layer 304 was formed. The domains of C-Si$_3$N$_4$ layer 303A exposed on the substrate surface were about 300 μm in width with intervals of 200 μm.

Further, by use of this substrate 118, crystalline silicon was deposited by means of the device shown in FIG. 1 similarly as described in Example 1.

By use of Si$_2$F$_6$ as the starting gas for formation of radicals containing silicon and halogen, this was permitted to flow into the reaction furnace maintained at 800° C. to be decomposed therein, followed by release through the introducing pipe 102 into the acting chamber 108. At the same time, F$_2$ was permitted to flow at 1.0 SCCM through the introducing pipe 111, and microwave of 2.45 GHz was introduced at a power of 0.7 w/cm$^2$ to be discharged and released into the acting chamber 113. H$_2$ gas was permitted to flow by use of the introducing pipe 103, maintained at a pressure of 0.2 Torr and microwave of 2.45 GHz was introduced at a 0.5 w/cm$^2$ to effect discharging and decompose H$_2$, followed by release into the acting chamber 108. The substrate temperature was maintained at 310° C. At this time, the ratio of the respective starting gases were varied in terms of the flow rate ratio of H$_2$ gas/Si$_2$F$_2$ decomposed gas flow rate as 5/100, 10/100, 15/100, 25/100 and 40/100, with H$_2$ being made constant at 30 SCCM, and 0.5 Torr was maintained for 1 hour for each case. As the result, films as shown in Table 5 were deposited. Among the respective samples, mobility was measured for samples No. 6-8 and 6-9 to obtain a value of 95 cm$^2$/V.sec for No. 6-8 and 72 for No. 6-9. Thus, it has been found that a polycrystalline film with extremely good strong orientation can be prepared. The grain size was measured by use of X-ray diffract meter and electron microscope.

Figure 3E:
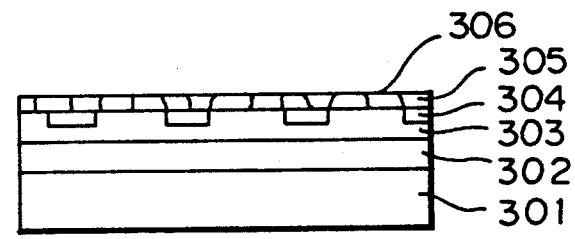

FIG. 3(E) shows a schematic sectional view of the crystalline silicon deposited film 305 obtained on the substrate 118.

306 in FIG. 3(E) shows crystal grain boundary.

EXAMPLE 8

The substrate 118 was prepared according to the steps shown in FIG. 4.

First, the polycrystalline silicon substrate 401 as shown in FIG. 4(A) was washed and then amorphous SiO$_2$ thin film 402 was deposited on the whole surface of the substrate 401 according to the sputtering method (in this case, other than the sputtering method, various thin film depositing methods such as vacuum vapor deposition method, plasma discharge method, MBE method, CVD method, etc., may be employed) [FIG. 4 (B)]. Next, amorphous Si$_3$N$_4$ thin film 403 was deposited on said SiO$_2$ thin film 402 [FIG. 4(C)].

Subsequently, electron beam resist layer 404 was applied on the Si$_3$N$_4$ thin film 403 [FIG. 4 (D)], the electron beam resist layer 404 was exposed to light by use of a photomask with a desired pattern and the electron beam resist layer 404 was partially removed by development [FIG. 4 (E)].

The Si$_3$N$_4$ thin film 403 was etched with the use of the residual electron beam resist layer 404A as the mask, Si$_3$N$_4$ N thin film 403A with a desired pattern was formed [FIG. 4 (F)].

According to the steps as described above, the substrate 118 having the portions 402A with the surface of the SiO$_2$ layer 402 being exposed at constant intervals from the Si$_3$N$_4$ thin film 402 was obtained.

The above Si$_3$N$_4$ thin film 403A was arranged on the SiO$_2$ thin film 402 with a width of 200 μm and an interval of 200 μm. Next, under the same conditions as sample No. 6-3 in Example 6, a crystalline silicon deposited film 405 with a thickness of about 3.0 μm was formed.

FIG. 4(G) shows a schematic sectional view of the polycrystalline deposited film 405 obtained on the substrate 118.

Next, when crystallinity of the silicon deposited film was evaluated according to the X-ray diffractometry and electron beam diffractometry by use of respective samples obtained, they were confirmed to be polycrystalline silicon films. Further, the grain size of the polycrystalline silicon determined by the Scherrar method was 0.8 μm. The variance in crystal grain size was substantially uniform over the whole substrate.

Also, when the surface state of the sample was observed by a scanning type electron microscope, the smoothness was found to be good without wavy pattern, etc., and the film thickness irregularity was ±4% or less. Also, when the mobility and electroconductivity of the crystalline Si deposited film of the sample prepared were measured according to the Van der Pauw method, they were found to be 300 (cm/V.sec) and 9×10$^{-6}$ (S.cm$^{-1}$), respectively.

EXAMPLE 9

The substrate 118 was prepared according to the steps shown in FIG. 4.

First, a glass substrate 401 comprising a uniform composition material as shown in FIG. 4(A) was washed and then amorphous SiN:H thin film 402 was formed over the whole surface of the substrate 401 by use of SiH$_4$ gas and NH$_3$ gas according to the plasma CVD method to a thickness of about 2 μm [FIG. 4 (B)].

Subsequently, amorphous SiO$_2$ thin film 404 was formed according to the sputtering method on the above SiN:H thin film 402 to a thickness of 500 Å [FIG. 4(C)]. Subsequently, on the SiO$_2$ thin film 403 was applied electron beam resist layer 404 [FIG. 4 (D)], and the electron beam resist layer 404 was exposed by use of a photomask with a desired pattern to remove partially the electron beam resist layer 404 [FIG. 4 (E)]. The SiO$_2$ thin film 403 was etched with the use of the residual electron beam resist layer 404A as the mask to form a SiO$_2$ thin film 403A with a desired pattern [FIG. 4(F)].

According to the steps as described above, the substrate 118 having a portion 402A with Si$_3$N$_4$ layers exposed at constant intervals and other portions covered with SiO$_2$ layer 403A was formed. The domains of the Si$_3$N$_4$ layer 402A exposed on the surface of the substrate 118 were arranged with a width of about 300 μm and an interval of 280 μm.

Next, by use of the substrate 118, crystalline silicon was deposited by the device as shown in FIG. 1 in the same manner as in Example 6. The film conditions were the same as sample No. 6-8 in Example 7, and the film was prepared to a thickness of about 2 μm.

FIG. 4(G) shows a schematic sectional view of the crystalline silicon deposited film 405 obtained on the substrate 118.

Further, by use of the respective samples obtained, crystallinity of deposited film was evaluated according to X-ray diffractometry and electron beam diffractometry, it was confirmed to be polycrystalline silicon film with a grain size of about 0.75 μm. The variance of crystal grain size was substantially uniform over the whole surface of the substrate.

Also, when the surface state of the sample was observed by a scanning type electronmicroscope, the smoothness was good with no wavy pattern, etc., and the film thickness irregularity was found to be ±4% or less. Also, when the mobility and electroconductivity of the polycrystalline Si deposited film of the sample obtained were measured according to the Van der Pauw method, they are found to be 86 (cm/V.sec) and 4×10$^{-6}$ (S.cm$^{-1}$), respectively.

The method for forming deposited film of the present invention can form a deposited film only by contacting an activated species (A) with an activated species (B), and has the advantage of requiring particularly no reaction exciting energy from the outside. Accordingly, it becomes possible to lower the substrate temperature. Also, since a material which becomes the crystal nucleus for the deposited film or capable of forming selectively the crystal nucleus can be arranged at a desired position on the substrate surface, any desired polycrystalline or single crystalline deposited film with extremely high orientation and great grain size can be formed. Further, simultaneously with saving of energy, it is possible to obtain a crystalline deposited film having uniform film quality and characteristics over a large area with easy management of the film quality. Further, a crystalline film excellent in productivity, bulk productivity and having high quality with excellent electrical, optical semiconductive and other physical properties can be obtained with ease.

TABLE 1

| | Sample No. | | | | |
|---|---|---|---|---|---|
| | 1 | 2 | 3 | 4 | 5 |
| F$_2$ gas flow rate (SCCM)/SiF$_4$ gas flow rate (SCCM) | 5/100 | 20/100 | 30/100 | 60/100 | 80/100 |
| Peak intensity ratio of diffraction of 220/111 by X-ray | 30/0 | 60/0 | 100/0 | 100/20 | 100/30 |
| Grain size (Å) | 1150 | 2600 | 4050 | 1700 | 300 |
| Deposition rate (Å/sec) | 8.2 | 13.6 | 4.7 | 1.8 | 1.5 |

*Calculated in view of I/I$_0$ ratio of ASTM card

TABLE 2

| | Sample No. | | | | |
|---|---|---|---|---|---|
| | 6 | 7 | 8 | 9 | 10 |
| $F_2$ gas flow rate (SCCM)/SiF$_4$ gas flow rate (SCCM) | 5/100 | 15/100 | 25/100 | 35/100 | 50/100 |
| Peak intensity ratio of diffraction of 220/111 by X-ray | 25/20 | 90/10 | 100/0 | 80/0 | 50/0 |
| Grain size (Å) | 400 | 1200 | 4750 | 3060 | 900 |
| Deposition rate (Å/sec) | 11.8 | 12.5 | 10.0 | 6.0 5.0 | 3.0 |

TABLE 3

| | Sample No. | |
|---|---|---|
| | 3 | 8 |
| Ratio of the maximum value and the minimum value of drain current* | $2.5 \times 10^5$ | $4 \times 10^5$ |
| Electrical field effect mobility** (cm$^2$/V sec) | 40 | 68 |
| Threshold value voltage** (V) | 5.4 | 3.0 |

*Measured by varying gate voltage (drain voltage $V_D = 10$ V made constant)

**Calculated from $\sqrt{I_D} - V_G$ dependency

TABLE 4

| | Sample No. | | | | |
|---|---|---|---|---|---|
| | 6-1 | 6-2 | 6-3 | 6-4 | 6-5 |
| H$_2$ gas flow rate (SCCM)/SiF$_4$ gas flow rate (SCCM) | 5/100 | 15/100 | 25/100 | 30/100 | 50/100 |
| Peak intensity ratio of diffraction of 220/111 by X-ray | 30/0 | 60/0 | 100/0 | 100/20 | 100/30 |
| Grain size (Å) | 1560 | 2900 | 4100 | 1500 | 350 |
| Disposition rate (Å/sec) | 10.5 | 14.0 | 5.2 | 2.0 | 0.8 |

*Calculated in view of $I/I_0$ ratio of ASTM card

TABLE 5

| | Sample No. | | | | |
|---|---|---|---|---|---|
| | 6-6 | 6-7 | 6-8 | 6-9 | 6-10 |
| (SCCM) H$_2$ gas Flow rate/SiF$_6$ gas flow rate | 5/100 | 10/100 | 15/100 | 25/100 | 40/100 |
| Peak intensity ratio of diffraction of 220/111 by X-ray | 30/20 | 90/10 | 100/0 | 85/0 | 45/0 |
| Grain size (Å) | 550 | 1300 | 5000 | 3550 | 850 |
| Deposition rate (Å/sec) | 10.0 | 10.5 | 9.0 | 6.0 | 2.0 |

What is claimed:

1. A process for forming a crystalline deposited film on a substrate surface in a film forming space, which comprises:
    (a) preparing the surface on which spaced crystal nuclei are present for forming said crystalline deposited film by arranging said crystal nuclei at a desired position on said surface;
    (b) forming said crystalline deposited film on said surface of said substrate by separately introducing into said film forming space an activated species (A) formed by decomposition of a compound (SX) containing silicon and a halogen and an activated species (B) formed from a chemical substance for film formation which is chemically mutually reactive with said activated species (A) and said activated species (A) being formed in an activation space (A) different from the film forming space, and said activated species (B) being formed in an activation space (B) different from the film forming space, to form a mixture and effect chemical reaction therebetween to thereby effect the formation of the crystalline deposited film, said crystalline deposited film having a surface;
    (c) producing an etching action on the crystalline deposited film by exposing the crystalline deposited film surface to a gaseous substance (E) capable of effecting an etching action thereon, and thereby effecting crystal growth in a specific face direction.

2. A process according to claim 1 wherein said gaseous substance (E) is elemental halogen, a halogen compound or an activated species (C) formed from said halogen or halogen compound.

* * * * *

UNITED STATES PATENT AND TRADEMARK OFFICE
CERTIFICATE OF CORRECTION

PATENT NO. : 5,135,607
DATED : August 4, 1992
INVENTOR(S) : YUTAKA HIRAI

It is certified that error appears in the above-identified patent and that said Letters Patent is hereby corrected as shown below:

ON THE TITLE PAGE,
AT [56] REFERENCES CITED

Foreign Patent Documents, "0240916 11/1986 Netherlands" should read --0240916 11/1986 Dem. Rep. of Germany--.

AT [57] ABSTRACT

Line 7, "formed" should read --formed by--.
Line 13, "affect" should read --effect--.
Line 17, "in" should read --in a--.

COLUMN 1

Line 24, "been" (second occurrence) should be deleted.
Line 28, "no" should be deleted.
Line 42, "give frequently" should read --frequently give--.
Line 52, "practically," should read --practically--.

COLUMN 6

Line 10, "grow&h" should read --growth--.
Line 32, "ists" should read --ist--.
Line 61, "grow&h" should read --growth--.

COLUMN 7

Line 3, "arranged" should read --arrange--.
Line 47, GaF2,ZnS," should read --$GaF_2$, ZnS,--.

UNITED STATES PATENT AND TRADEMARK OFFICE
CERTIFICATE OF CORRECTION

PATENT NO. : 5,135,607

DATED : August 4, 1992

INVENTOR(S) : YUTAKA HIRAI

It is certified that error appears in the above-identified patent and that said Letters Patent is hereby corrected as shown below:

COLUMN 8

Line 56, "a" should be deleted.

COLUMN 9

Line 66, "si±e" should read --size--.

COLUMN 10

Line 21, "X$10^6$ V/cm $V_{FB} \approx 0V$" should read --3X$10^6$ V/cm $V_{FB} \approx 0V$--.

Line 34, "of X$10^{-4}$A" should read --of 8X$10^{-4}$A--.

COLUMN 11

Line 61, "42 cm$^2$/V sec" should read --42 cm$^2$/V·sec--.

COLUMN 13

Line 17, "$Si_3N_4$ N" should read --$Si_3N_4$--.

UNITED STATES PATENT AND TRADEMARK OFFICE
CERTIFICATE OF CORRECTION

PATENT NO. : 5,135,607

DATED : August 4, 1992

INVENTOR(S) : YUTAKA HIRAI

It is certified that error appears in the above-identified patent and that said Letters Patent is hereby corrected as shown below:

<u>COLUMN 16</u>

Line 37, "surface;" should read --surface; and--.
    Line 42, "claim 1" should read --claim 1,--.

Signed and Sealed this

Twelfth Day of October, 1993

Attest:

BRUCE LEHMAN

*Attesting Officer*  *Commissioner of Patents and Trademarks*